United States Patent [19]
Slattery et al.

[11] Patent Number: 5,361,005
[45] Date of Patent: Nov. 1, 1994

[54] CONFIGURABLE DRIVER CIRCUIT AND TERMINATION FOR A COMPUTER INPUT/OUTPUT BUS

[75] Inventors: John W. Slattery, Loveland; Mark J. Jedrzejewski, Fort Collins; Terry W. Norton, Longmont, all of Colo.

[73] Assignee: Hewlett-Packard Company, Palo Alto, Calif.

[21] Appl. No.: 40,815

[22] Filed: Mar. 31, 1993

[51] Int. Cl.⁵ ........................ H03K 19/0185
[52] U.S. Cl. ........................ 326/56; 326/82; 327/108; 327/310
[58] Field of Search ............... 307/262, 268, 270, 362, 307/473, 542, 550, 555, 576, 572

[56] References Cited

U.S. PATENT DOCUMENTS

| | | | |
|---|---|---|---|
| 4,866,309 | 9/1989 | Bonke et al. | 307/473 |
| 5,107,142 | 4/1992 | Bhamidipaty | 307/473 |
| 5,136,185 | 8/1992 | Fleming et al. | 307/473 |
| 5,151,621 | 9/1992 | Goto | 307/473 |
| 5,285,119 | 2/1994 | Takahashi | 307/473 |

Primary Examiner—Timothy P. Callahan
Assistant Examiner—Shawn Riley
Attorney, Agent, or Firm—Augustus W. Winfield

[57] ABSTRACT

A configurable driver/termination circuit for use in a peripheral device connected to a computer input/output controller bus. The driver/termination circuit has the pull-up current source characteristics of a three-state driver and the pull-down current sink characteristics of a open collector driver. Logic circuit defines the operating mode. In a default mode, the driver/termination circuit can function in either open collector or three-state bus designs. The circuit mode is changed by command from a host computer to explicitly operate as an open collector driver/terminator, as a three-state driver, or as an inactive high impedance. Alternatively, peripheral devices automatically select the mode which minimizes data transmission errors.

3 Claims, 4 Drawing Sheets

| IN | PUE | OUTPUT |
|---|---|---|
| 0 | 0 | 0 |
| 0 | 1 | 0 |
| 1 | 0 | Z |
| 1 | 1 | 1 |

FIG 4

CONFIGURABLE DRIVER CIRCUIT AND TERMINATION FOR A COMPUTER INPUT/OUTPUT BUS

FIELD OF INVENTION

This invention relates generally to busses for connecting a computer to peripheral devices and more specifically to driver circuits for bus signal lines and termination of bus signal lines.

BACKGROUND OF THE INVENTION

Computers often have various input/output (I/O) controllers connected to peripheral devices such as flexible disks, tape drives, printers, scanners, etc. For example, computers compatible with the IBM PC-AT and IBM PS/2 personal computers typically have one or more flexible disk drives and one or more tape backup devices being controlled by a single flexible disk controller. Each signal/control line in the I/O bus connects to each peripheral device. It is desirable to have a single design for driving and terminating I/O bus lines by peripheral devices which can work with any controller driver/termination design. However, different controllers for different host systems may place incompatible requirements on I/O bus line drive circuit design and I/O bus line termination within peripheral devices.

For example, for flexible disks and tape drives being controlled by flexible disk controllers, there is a data and control bus which is shared by the controller and each of the peripheral devices. Individual I/O bus lines may be driven by a single device such as the controller or some lines may be driven by each of the drives and the controller. Data rates for flexible disk I/O busses are on the order of one million bits per second. The quiescent state of each bus line is typically high with data represented by negative going pulses. The time between successive leading edges is critical so that the fall time of each pulse is critical. In general, the rise times are not critical but must be fast enough to recover at the required data rate. However, lines with slower rise times are more susceptible to noise.

At any one time, data transfer on the I/O bus is limited to the flexible disk controller and one selected peripheral device. The peripheral device is selected by either a hardware select line or a software command. Unselected devices on the I/O bus must present a high impedance load to the I/O bus.

Flexible disk controllers for computers compatible with the IBM PC-AT personal computers and drives connected to such controllers typically drive signal and control lines with an open collector driver. For these controllers and drives. each bus line is typically terminated by a single pull-up resistor. For fast rise times, the passive pull-up must be a low impedance. The pull-up resistor is typically located on the last device on the I/O bus. The pull-up is always present regardless of the select status of the last device.

Flexible disk controllers for computers compatible with the IBM PS/2 personal computers and drives connected to such controllers typically drive each I/O bus line with a three-state (also called tri-state or totem pole) driver circuit. These circuits actively pull each line high. These circuits typically have limited current sink/source ability so that for these controllers and drives, each bus line must be terminated in a relatively high impedance.

If a open ended driver is used with a high impedance termination, rise times will be too slow and the line will be susceptible to noise. If a three-state driver is used with a low impedance termination, the three-state driver may not be able to sink the current from the low impedance source. Therefore, no single driver/termination design will work in all applications. The typical industry solution is use removable terminators or some sort of adapter board. However, not all peripheral manufacturers provide adapters or removable termination resistors. In addition, end users installing a new peripheral device may not realize the need to reconfigure termination resistors. A design is needed which can be commanded to the proper termination configuration. Alternatively, a design is needed which can sense its environment and automatically adapt to provide the proper line termination and driver circuit configuration.

SUMMARY OF THE INVENTION

The present invention provides an I/O bus line driver/termination circuit which can be electronically configured to operate in one of three modes. A default mode can typically function in either open collector environments or in three-state environments. The driver/termination circuit can also be configured to operate in an open collector mode with no pull-up if that mode is needed. Finally, the driver/termination circuit can be configured to act as an inactive high impedance, effectively taking a peripheral device "off-line."

BRIEF DESCRIPTION OF THE DRAWINGS

FIG. 4 is a logic truth table for the configurable driver circuits of FIG. 3.

DETAILED DESCRIPTION OF THE PREFERRED EMBODIMENT OF THE INVENTION

Figure 1:
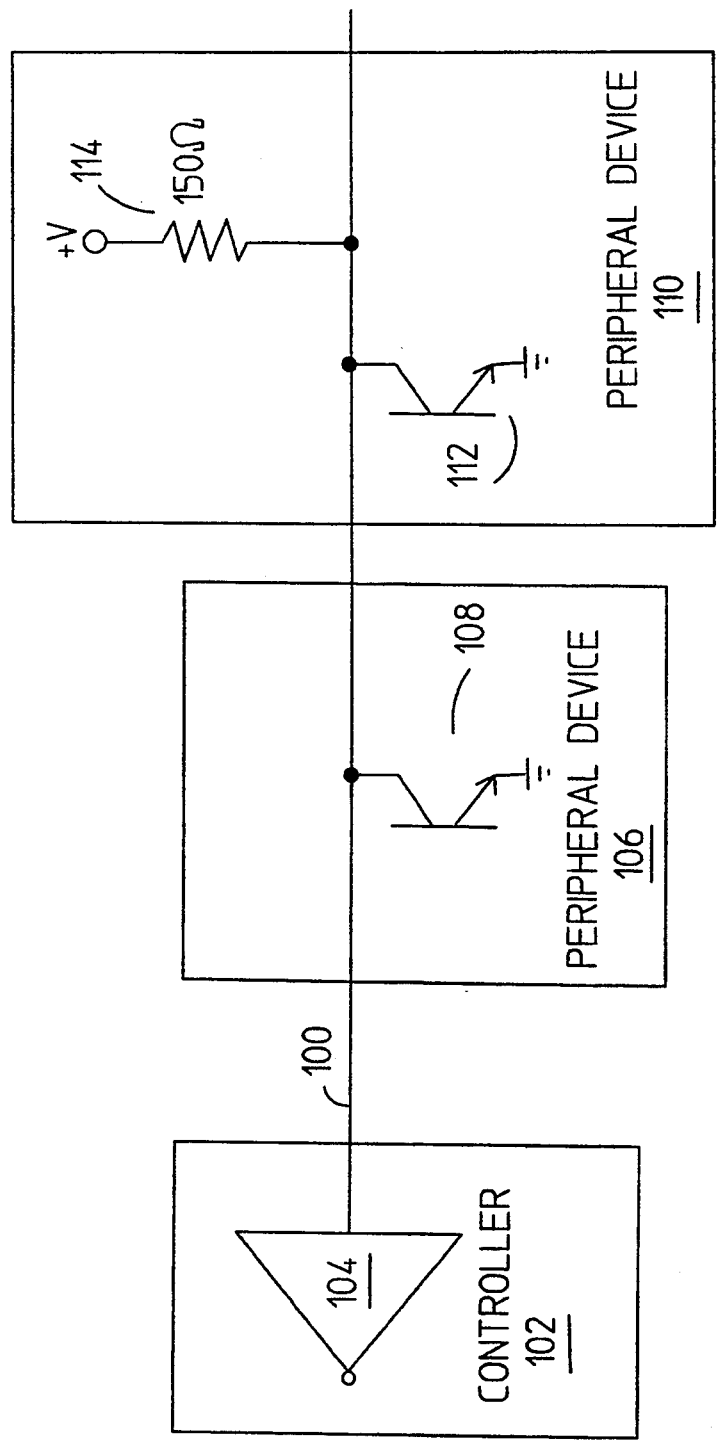
FIG. 1 is a block diagram schematic illustrating a bus with open collector driver circuits.

FIG. 1 illustrates an input/output bus with open collector drivers. In FIG. 1, a single signal or control line 100 represents one of many lines in the bus. A controller 102 has a logical gate 104 for receiving signals from peripheral devices on line 100. A first peripheral device 106 has an open collector driver transistor 108 with the collector connected to line 100. Likewise, a second peripheral device 110 has an open collector driver transistor 112 with the collector connected to line 100. In general, line 100 will have transmission line characteristics so that an impedance mismatch will result in reflections. In addition, low impedance is desirable to minimize electrically coupled noise. Finally, it is desirable to minimize current flowing through the entire length of the signal line. The typical termination approach for such a system is for the last device on the bus (110) to have a pull-up termination resistor (114). The pull-up resistor 114 is active at all times and is not affected by the status of device selection. No other device, such as peripheral device 106 should have a termination resistor.

Figure 2:
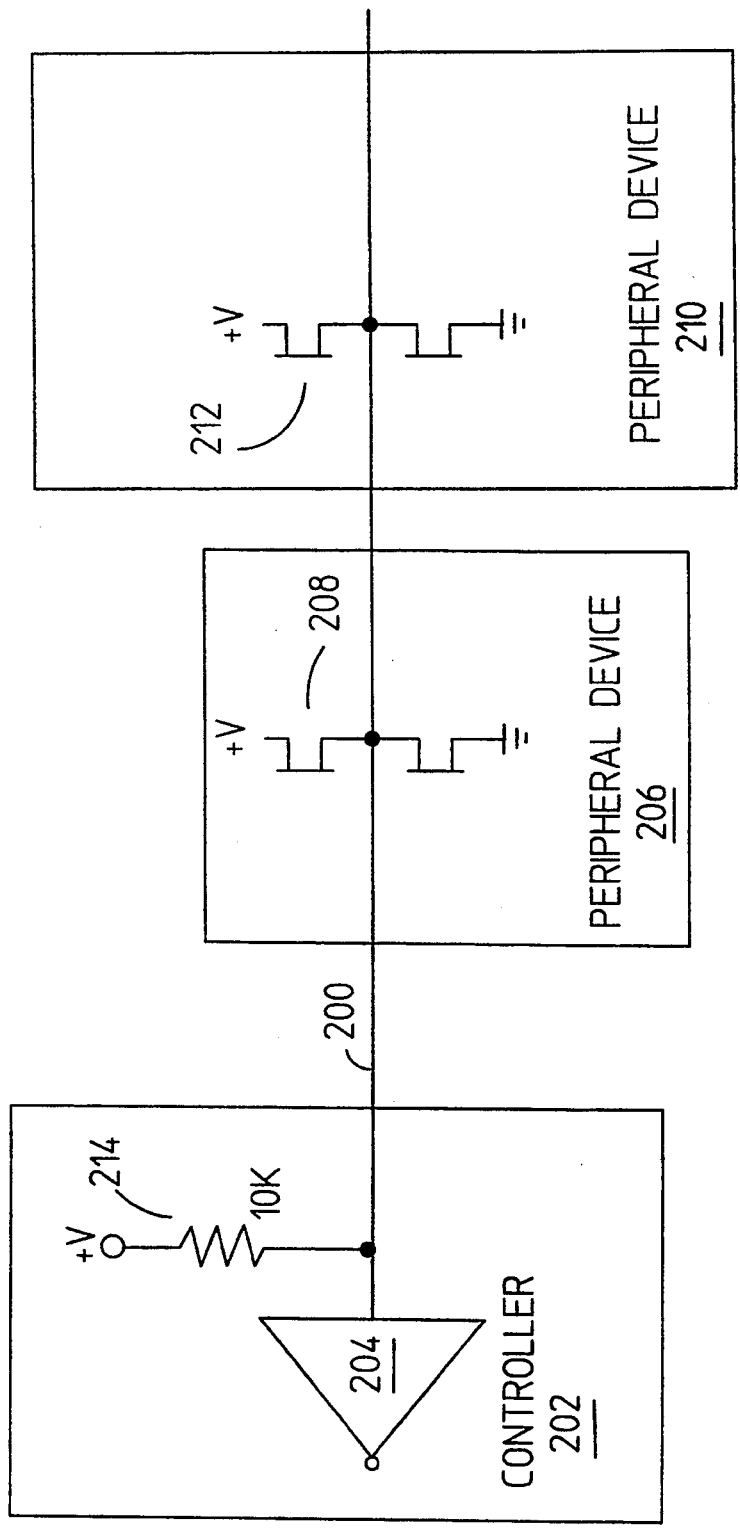
FIG. 2 is a block diagram schematic illustrating a bus with three-state driver circuits.

FIG. 2 illustrates a bus with three-state drivers. In FIG. 2, a single signal or control line 200 represents one of many lines in the bus. A controller 202 has a logical gate 204 for receiving signals from peripheral devices on line 200. A first peripheral device 206 has a three-state driver 208 with the output connected to line 200. Likewise, a second peripheral device 210 has a three-state driver 212 with the output connected to line 200. In general, typical three-state drivers have limited current source/sink ability so that any termination must be relatively high impedance. An example is resistor 214. In three-state busses, the termination resistor is typically located in the controller.

Figure 3:
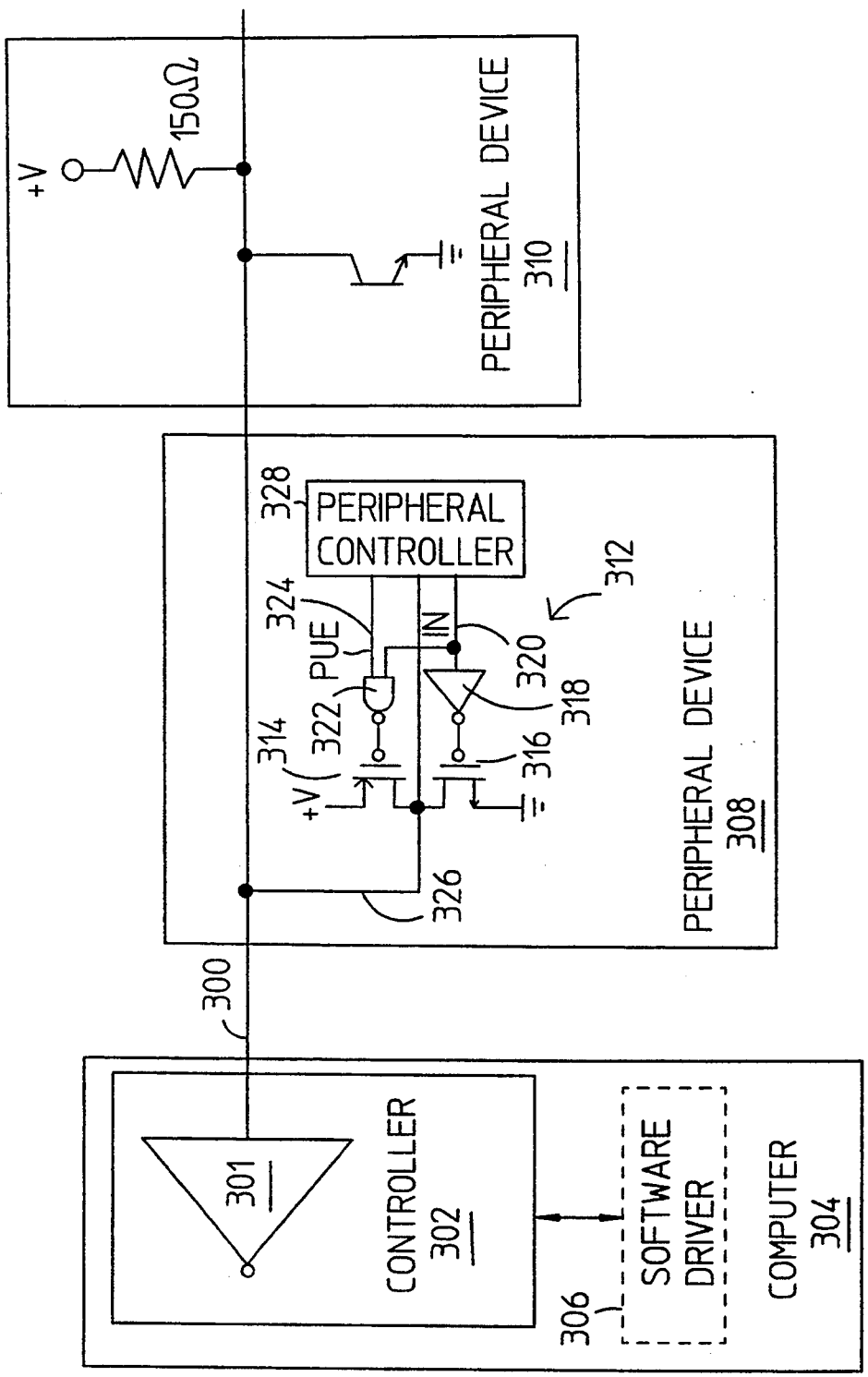
FIG. 3 is a block diagram schematic illustrating a bus with a driver circuit which can be configured for either an open collector or a three-state bus.

FIG. 3 illustrates a peripheral device with a configurable driver/termination circuit in accordance with the present invention. In FIG. 3, a signal/control line 300 is connected to an input of a logical gate 301 in a host controller 302. As illustrated in FIG. 3, device 310 has an open collector driver and pull-up resistor as illustrated in FIG. 1, 110. However, for the present invention, device 310 could alternatively have a three-state driver as illustrated in FIG. 2, 210. That is, the signal/control line 300 may be either an open collector bus with a low impedance pull-up (FIG. 1, 100, 114) or a three-state bus with high impedance pull-up (FIG. 2, 200, 214). The host controller 302 is within a computer 304 and interacts with controller software driver 306. Peripheral devices (308 and 310) are illustrated as external peripherals but they may be physically mounted within the computer 304.

Peripheral device 308 has a configurable driver/termination circuit 312. The driver/termination circuit 312 is comprised of asymmetrical three-state drivers along with some logic gates. Within the three-state drivers, a P-channel device 314 can source about 8 mA whereas the N-channel device 316 can sink about 48 mA. The logic gates comprise an inverter 318 with input signal (IN) 320 and NAND gate 322 with inputs IN 320 and PUE 324. Each driver/termination circuit 312 has a terminal 326 connected to the signal/control line 300.

Figure 4:
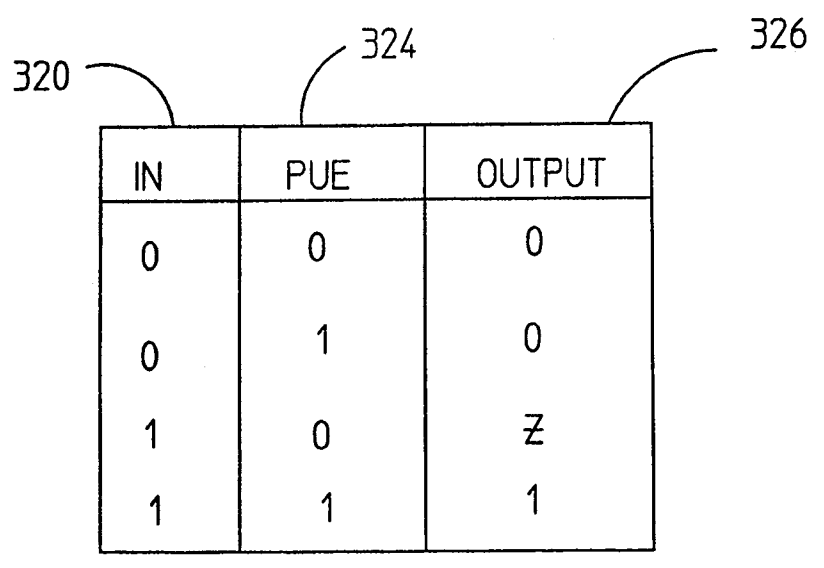

FIG. 4 is a logic truth table for the driver/termination circuit 312 illustrated in FIG. 3. One signal is the Pull-Up Enable (PUE) signal 324. A second signal is the Input (IN) signal 320. If IN 320 is logically TRUE and PUE 324 is logically FALSE, then output 326 is a high impedance. This effectively takes the peripheral device "off-line." If PUE 324 is logically TRUE, the driver/termination circuit 312 functions as a three-state driver in active output mode. Because of the high current sinking capability, with PUE 324 logically TRUE, the driver/termination circuit 312 also functions as an open collector driver circuit with pull-up. If PUE 324 is logically FALSE and IN 320 is used as a signal input, then the driver/termination circuit 312 acts as an open collector driver circuit with no pull-up.

Empirically, it has been observed in the application of the present invention that if peripheral device 308 is in the three-state mode (PUE 324=TRUE) then signal distortion is acceptably low even in an open collector environment (FIG. 1). Therefore, the three-state mode (PUE=TRUE) is the preferred default state when the device is selected. However, the present invention also provides the ability for configuration by a host computer or for automatic configuration.

In FIG. 3, peripheral device 308 also has a peripheral controller 328. The software driver 306 sends commands and data over the I/O bus comprising lines such as line 300 to the peripheral controller 328 for performance of peripheral specific functions. Likewise, the peripheral controllers 328 send commands and data to the software driver 306. In one embodiment of the present invention, the host computer 304 containing host controller 302 sends a command via the software driver 306 to a peripheral controller 328 in a peripheral device (308) containing the configurable driver/termination circuits 312. The host computer 304 commands each peripheral controller 328 to place its associated driver/termination circuit 312 to be in one of three modes as follows:

1. a high impedance inactive mode (PUE=FALSE, IN=TRUE);
2. a three-state device mode or an open collector device mode with pull-up (PUE=TRUE, IN=signal output); or
3. an open collector device mode without pull-up (PUE=FALSE, IN=signal output).

In an alternative embodiment, each peripheral device (308 or 310) automatically configures the driver/termination circuits 312 to minimize data transmission errors. Typically, data signals on an I/O bus such as FIG. 3, 300 include some sort of error detection. If the host controller 302 senses a data transmission error, the host controller 302 commands the appropriate peripheral controller 328 to retransmit the data. In the alternative embodiment, peripheral controllers 328 monitor retransmission commands from the host controller 302. The retransmission command rate is measured for each driver mode 2-3 as described above. The peripheral device then automatically configures itself to the mode which minimizes errors. For example, there may be a pull-up termination in one or more drives so that active pull-up in a configurable drive causes the current to exceed the current sinking capability of other drivers. By selecting mode 3 as described above, the current sinking requirements are reduced for all drivers.

From the above it can be seen that the present invention provides a driver/termination circuit which enables a drive to function with multiple types of controllers without requiring a user to configure removable terminators or adapter boards. A default mode is suitable for either of two typical controller designs. If the default mode is not suitable, a peripheral device can be commanded by the host computer to change the mode or the peripheral device can sense errors and automatically change modes to minimize errors.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A circuit for driving and terminating a digital signal line on a data bus, the circuit comprising:
   a signal input having first and second signal logical states;
   a pull-up enable input having first and second pull-up logical states;
   a current source connected to the digital signal line, having a first source control input connected to the signal input and a second source control input connected to the pull-up enable input;

a current sink connected to the digital signal line, having a sink control input connected to the signal input;

wherein when the pull-up enable input is in the first pull-up logical state, the current source is off, the current sink is on if the signal input is in the first signal logical state, and the current sink is off if the signal input is in the second signal logical state; and wherein when the pull-up enable input is in the second pull-up logical state, the current sink is on and the current source is off if the signal input is in the first signal logical state, and the current source is on and the current sink is off if the signal input is in the second signal logical state.

2. The circuit of claim 1 wherein the pull-up enable input and the digital signal line are connected to a peripheral controller and wherein the bus is connected to a controller in a computer and wherein a software driver in the computer sends a command over the bus to the peripheral controller, and wherein the command determines whether the pull-up enable input is in the first or second pull-up state.

3. The circuit of claim 1 wherein the pull-up enable input is connected to a peripheral controller and wherein the peripheral controller determines whether the pull-up enable input is in the first or second pull-up state.

* * * * *